(12) United States Patent
Kong et al.

(10) Patent No.: US 11,017,722 B1
(45) Date of Patent: May 25, 2021

(54) DISPLAY SUBSTRATE, DISPLAY DEVICE, AND CONTROL METHOD THEREOF

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Chao Kong, Beijing (CN); Yamin Yang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/807,504

(22) Filed: Mar. 3, 2020

(30) Foreign Application Priority Data

Dec. 11, 2019 (CN) .......................... 201911264298.6

(51) Int. Cl.
*G09G 3/32* (2016.01)
*G09G 3/3258* (2016.01)
*H01L 27/32* (2006.01)

(52) U.S. Cl.
CPC .......... *G09G 3/3258* (2013.01); *H01L 27/326* (2013.01); *G09G 2320/041* (2013.01); *G09G 2320/0633* (2013.01)

(58) Field of Classification Search
CPC ...... G09G 3/2074; G09G 3/32; G09G 3/3208; G09G 3/3258; G09G 3/3607; G09G 2300/0452; G09G 2320/0242; G09G 2320/041; G09G 2320/0633; G09G 2320/0666; G02F 2201/52; H01L 27/3211; H01L 27/3213; H01L 27/3216; H01L 27/3218; H01L 27/326
See application file for complete search history.

*Primary Examiner* — Michael J Eurice
(74) *Attorney, Agent, or Firm* — The Webb Law Firm

(57) ABSTRACT

The present disclosure relates to a display substrate, a display device, and a control method thereof. The display substrate includes a plurality of pixels, each of which includes a first sub-pixel, a second sub-pixel, a third sub-pixel, and a fourth sub-pixel. The first sub-pixel, the second sub-pixel, and the third sub-pixel have different light emission colors. The fourth sub-pixel has the same light emission color as the first sub-pixel. The first sub-pixel, the second sub-pixel, the third sub-pixel, and the fourth sub-pixel all emit light, in a case where an ambient temperature is less than a first threshold. The second sub-pixel and the third sub-pixel both emit light, and one of the fourth sub-pixel and the first sub-pixel emits light, in a case where the ambient temperature is greater than or equal to the first threshold.

15 Claims, 11 Drawing Sheets

Measure an ambient temperature — S1002

Control light emission brightness of respective sub-pixels in each of the plurality of pixels according to the ambient temperature — S1004

DISPLAY SUBSTRATE, DISPLAY DEVICE, AND CONTROL METHOD THEREOF

CROSS-REFERENCE TO RELATED APPLICATIONS

The present application is based on and claims priority to China Patent Application No. 201911264298.6 filed on Dec. 11, 2019, the disclosure of which is incorporated by reference herein in its entirety.

TECHNICAL FIELD

The present disclosure relates to a display substrate, a display device, and a control method thereof.

BACKGROUND

With the progress in organic semiconductor technology, the Organic Light Emitting Diode (OLED) has been gradually well developed, so that it is increasingly widely applied in fields such as lighting and display. Different from the conventional cathode ray tube (CRT) display, plasma display panel (PDP), liquid crystal display (LCD) and the like, the OLED display has the characteristics of independent light emission, flexibility, wide viewing angle, fast response speed, ultra slim, high luminous efficiency, low power consumption and wide operating temperature. Therefore, the OLED display is considered as a new-generation display with more application prospects.

An external quantum efficiency of the OLED device is the ratio of the number of photons emitted outward from the device to the number of electron-hole pairs injected. Those skilled in the art have made unremitting efforts to obtain a high quantum efficiency. The phosphorescent material with a quantum efficiency of 100% has been widely applied in the OLED lighting and display devices.

SUMMARY

According to an aspect of the embodiments of the present disclosure, a display substrate is provided. The display substrate comprises: a plurality of pixels, each of which comprises a first sub-pixel, a second sub-pixel, a third sub-pixel, and a fourth sub-pixel; wherein: the first sub-pixel, the second sub-pixel, and the third sub-pixel have different light emission colors, and the fourth sub-pixel has a same light emission color as the first sub-pixel; the first sub-pixel, the second sub-pixel, the third sub-pixel, and the fourth sub-pixel all emit light, in a case where an ambient temperature is less than a first threshold; the second sub-pixel and the third sub-pixel both emit light, and one of the fourth sub-pixel and the first sub-pixel emits light, in a case where the ambient temperature is greater than or equal to the first threshold.

In some embodiments, an area of an opening of the first sub-pixel is greater than that of an opening of the fourth sub-pixel.

In some embodiments, the second sub-pixel, the third sub-pixel, and the fourth sub-pixel all emit light, and the first sub-pixel does not emit light, in a case where the ambient temperature is greater than a second threshold, wherein the second threshold is greater than the first threshold; and the second sub-pixel and the third sub-pixel both emit light, and one of the fourth sub-pixel and the first sub-pixel emits light, in a case where the ambient temperature is greater than or equal to the first threshold and the ambient temperature is less than or equal to the second threshold.

In some embodiments, in each of the plurality of pixels, the first sub-pixel, the second sub-pixel, the third sub-pixel, and the fourth sub-pixel are in a same row, the second sub-pixel is between the first sub-pixel and the third sub-pixel, and the fourth sub-pixel is on a side of the first sub-pixel remote from the second sub-pixel.

In some embodiments, a shape of an opening of each sub-pixel is a stripe shape, and a length direction of the stripe shape intersects with a row direction, in which sub-pixels in each pixel are arranged.

In some embodiments, the third sub-pixel and the first sub-pixel are in a first row, the second sub-pixel and the fourth sub-pixel are in a second row adjacent to the first row, the third sub-pixel and the second sub-pixel are in a first column, and the first sub-pixel and the fourth sub-pixel are in a second column adjacent to the first column.

In some embodiments, the second sub-pixel comprised in each of the plurality of pixels is a separate second sub-pixel, and every two pixels share one first sub-pixel, one third sub-pixel, and one fourth sub-pixel.

In some embodiments, the second sub-pixel comprised in each of the plurality of pixels is a separate second sub-pixel, the fourth sub-pixel comprised in each of the plurality of pixels is a separate fourth sub-pixel, and every two pixels share one first sub-pixel and one third sub-pixel.

In some embodiments, a light emission color of the fourth sub-pixel is red, green, or blue.

In some embodiments, each of the plurality of pixels further comprises a fifth sub-pixel, wherein a light emission color of the fifth sub-pixel is the same as that of the second sub-pixel or the third sub-pixel.

In some embodiments, a light emission color of the first sub-pixel is red, a light emission color of the second sub-pixel is green, and a light emission color of the third sub-pixel is blue.

In some embodiments, the display substrate further comprises: a temperature sensor configured to measure the ambient temperature; and a control circuit configured to control light emission brightness of the fourth sub-pixel according to the ambient temperature.

In some embodiments, the control circuit is further configured to control light emission brightness of the first sub-pixel, the second sub-pixel, and the third sub-pixel according to the ambient temperature.

In some embodiments, the first threshold ranges from $-10°$ C. to $0°$ C.

In some embodiments, the second threshold ranges from $35°$ C. to $50°$ C.

According to another aspect of the embodiments of the present disclosure, a display device is provided. The display device comprises the display substrate as described above.

According to another aspect of the embodiments of the present disclosure, a control method for a display device comprising a display substrate is provided. The display substrate comprises: a plurality of pixels, each of which comprises a first sub-pixel, a second sub-pixel, a third sub-pixel, and a fourth sub-pixel; the first sub-pixel, the second sub-pixel, and the third sub-pixel have different light emission colors, and the fourth sub-pixel has a same light emission color as a light emission color of the first sub-pixel. The control method comprises: measuring an ambient temperature; and controlling light emission brightness of respective sub-pixels in each of the plurality of pixels according to the ambient temperature; wherein the first sub-pixel, the second sub-pixel, the third sub-pixel, and the fourth subpixel are all controlled to emit light, in a case where the ambient temperature is less than a first threshold; and the second sub-pixel and the third sub-pixel are controlled to emit light, and one of the fourth sub-pixel and the first sub-pixel is controlled to emit light, in a case where the ambient temperature is greater than or equal to the first threshold.

In some embodiments, an area of an opening of the first sub-pixel is greater than that of an opening of the fourth sub-pixel; and controlling the second sub-pixel and the third sub-pixel to emit light and one of the fourth sub-pixel and the first sub-pixel to emit light comprises: controlling the second sub-pixel, the third sub-pixel, and the fourth sub-pixel to emit light, and the first sub-pixel not to emit light, in a case where the ambient temperature is greater than a second threshold, wherein the second threshold is greater than the first threshold; and controlling the second sub-pixel and the third sub-pixel to emit light, and one of the fourth sub-pixel and the first sub-pixel to emit light, in a case where the ambient temperature is greater than or equal to the first threshold and the ambient temperature is less than or equal to the second threshold.

Other features and advantages of the present disclosure will become apparent from the following detailed description of exemplary embodiments of the present disclosure with reference to the accompanying drawings.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure may be more clearly understood from the following detailed description with reference to the accompanying drawings, in which.

Figure 1A:
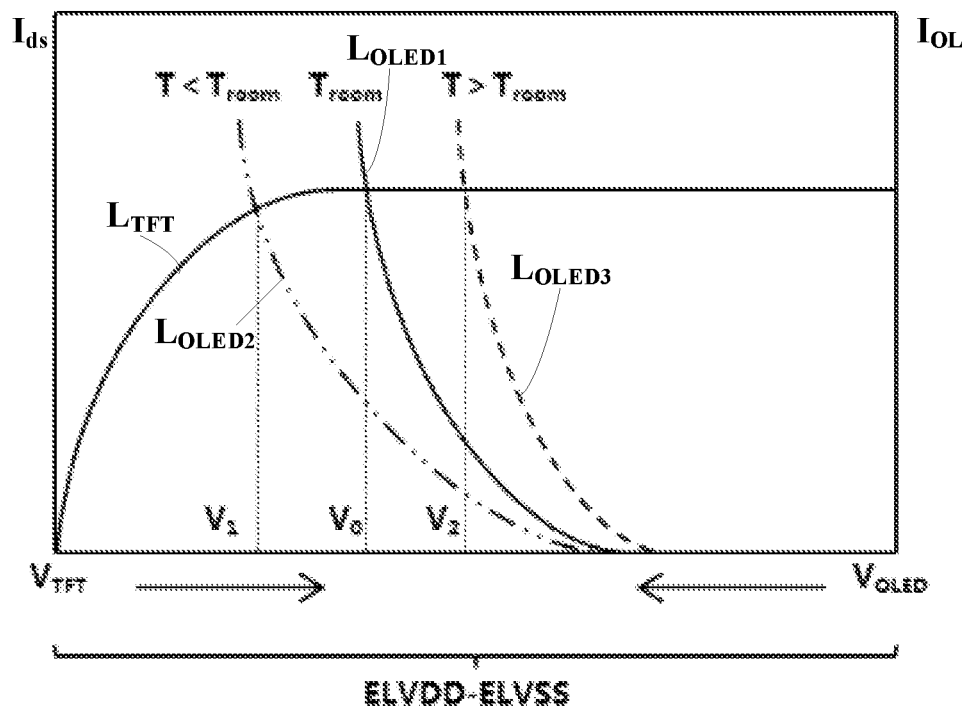
FIG. 1A is a schematic diagram showing I-V curves of a driving transistor and a light emitting device of a sub-pixel of a display substrate according to an embodiment of the present disclosure.

It should be understood that the dimensions of the various parts shown in the accompanying drawings are not drawn according to the actual scale. In addition, the same or similar reference signs are used to denote the same or similar components.

DETAILED DESCRIPTION

Various exemplary embodiments of the present disclosure will now be described in detail with reference to the accompanying drawings. The description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "include" or variants thereof means that the element before the word covers the element(s) listed after the word without excluding the possibility of also covering other elements. The terms "up", "down", "left", "right", or the like are used only to represent a relative positional relationship, and the relative positional relationship may be changed correspondingly if the absolute position of the described object changes.

In the present disclosure, when it is described that a particular device is located between the first device and the second device, there may be an intermediate device between the particular device and the first device or the second device, and alternatively, there may be no intermediate device. When it is described that a particular device is connected to other devices, the particular device may be directly connected to said other devices without an intermediate device, and alternatively, may not be directly connected to said other devices but with an intermediate device.

All the terms (comprising technical and scientific terms) used in the present disclosure have the same meanings as understood by those skilled in the art of the present disclosure unless otherwise defined. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

The inventors of the present disclosure have found that among multiple layers of films constituting the OLED device, the mobility of the material in each layer of film has a close correlation with the temperature, which results in that the OLED device may be different in different operation environments. Currently, the OLED product is relatively high-end display products. If the OLED product is very different at a high or low temperature, it may greatly affect the experience during the use by the user.

Therefore, the inventors of the present disclosure have studied the mechanism of color cast of the OLED device at different temperatures, and explained that the mechanism is as follows:

In the related art, the relationship between the mobility µ and the temperature T may be described as the Arrhenius equation:

$$\mu = \mu_0 e^{\left(-\frac{\Delta E}{k_B T}\right)}, \qquad (1)$$

where $\mu_0$ is a pre-exponential factor, $k_B$ is the Boltzmann constant ($1.3806505 \times 10^{-23}$ J/K), and $\Delta E$ is an activation energy. In addition, there are the following relations:

the electrical conductivity σ is: σ=q·n·µ, (2)

where q is a charge amount and n is a carrier concentration.

The electric field intensity $E$ is: $E=J/\sigma$, (3)

where J is the current density.

The voltage $U$ is: $U=E \cdot d$, (4)

where d is a distance between two points along a direction of the field intensity.

From the above relations, it may be concluded that: as the operating temperature T of the device decreases, the mobility µ decreases, the electrical conductivity σ decreases, the electric field intensity E increases, and the voltage U also increases accordingly. Therefore, the operating voltage of the OLED device at a low temperature is higher than that of the OLED device at a normal temperature (for example, room temperature). Similarly, the operating voltage of the OLED device at a high temperature is lower than that of the OLED device at a normal temperature (for example, room temperature).

In the OLED display panel of the related art, one white light pixel may be composed of three sub-pixels of RGB (red, green, and blue). Generally, the display device (for example, an OLED display device) is adjusted to display the white balance at room temperature. However, at a high temperature or a low temperature, if the brightness of different colors of the light emitting device varies inconsistently with the temperature, it will cause the problem of color cast of the display device, thereby affecting the display effect of the display device. The mobility of each layer of material in the organic material of the OLED varies greatly with ambient temperature. Generally, low temperature may result in a reduced mobility of the organic material, thereby resulting in a drop in the light emission brightness. The R, G, and B sub-pixels have inconsistent dropping amplitudes in the brightness, thereby resulting in a deviation in the white balance point, and causing a change in the color temperature. In addition, the display device might also be used at a high temperature. At a high temperature, the mobility of the R, G, and B sub-pixels increases, thereby resulting in an increase in the overall brightness of the display device. The increase amplitude in the mobility of the R, G, and B sub-pixels at a high temperature might also be inconsistent, which may also result in a change in the color temperature of the white balance point, and further lead to color cast.

Figure 1B:
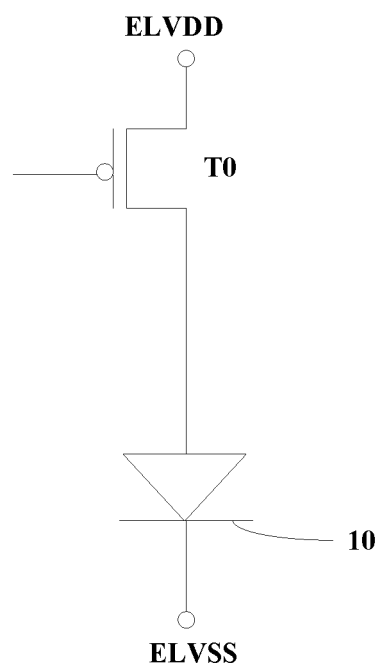
FIG. 1B is a schematic view showing a connection between a driving transistor and a light emitting device in a pixel circuit of a sub-pixel of a display substrate according to an embodiment of the present disclosure.

FIG. 1A is a schematic diagram showing I-V curves of a driving transistor and a light emitting device of a sub-pixel of a display substrate according to an embodiment of the present disclosure. FIG. 1B is a schematic view showing a connection between a driving transistor and a light emitting device in a pixel circuit of a sub-pixel of a display substrate according to an embodiment of the present disclosure.

It should be noted that FIG. 1B only shows the driving transistor T0 and the light emitting device (for example, OLED) 10 electrically connected to the driving transistor T0 in the pixel circuit, but does not show other devices (for example, switching transistors, capacitors or the like) in the pixel circuit. However, according to known art, those skilled in the art can understand that the pixel circuit may also comprise other devices, and can understand the connection relationship between the driving transistor T0, the light emitting device 10, and other devices, which thus will not be described in detail here.

FIG. 1A shows the I-V characteristic curve $L_{TFT}$ of the driving transistor $T_0$ and the I-V characteristic curves $L_{OLED1}$, $L_{OLED2}$, and $L_{OLED3}$ of the light emitting device at different temperatures. $L_{OLED1}$ is the I-V characteristic curve of the light emitting device at the operating temperature which is the room temperature $T_{room}$; $L_{OLED2}$ is the I-V characteristic curve of the light emitting device at the operating temperature which is lower than the room temperature $T_{room}$; and $L_{OLED3}$ is the I-V characteristic curve of the light emitting device at the operating temperature which is higher than the room temperature $T_{room}$. Here, the I-V characteristic curve $L_{TFT}$ of the driving transistor $T_0$ refers to a relationship curve of the source-drain current $I_{ds}$ flowing through the driving transistor and the voltage $V_{TFT}$ between the source and the drain of the driving transistor (i.e., the operating voltage of the driving transistor); and the I-V characteristic curve of the light emitting device refers to a relationship curve of the operating current $I_{OLED}$ flowing through the light emitting device and the voltage $V_{OLED}$ between the anode and the cathode of the light emitting device (i.e., the operating voltage of the light emitting device). A sum of the operating voltage $V_{TFT}$ of the driving transistor and the operating voltage $V_{OLED}$ of the light emitting device is ELVDD-ELVSS. Here, ELVDD is a power supply voltage, and ELVSS is a common ground voltage. In addition, in FIG. 1A, a direction indicated by an arrow of $V_{TFT}$ represents a direction in which $V_{TFT}$ is gradually increased, and a direction indicated by an arrow of $V_{OLED}$ represents a direction in which $V_{OLED}$ is gradually increased. $V_0$ represents the operating voltage of the light emitting device at the operating temperature which is the room temperature; $V_1$ represents the operating voltage of the light emitting device at the operating temperature which is lower than the room temperature; and $V_2$ represents the operating voltage of the light emitting device at the operating temperature which is higher than the room temperature.

It may be seen from FIG. 1A that as the operating temperature of the light emitting device increases, the operating voltage $V_{OLED}$ of the light emitting device gradually decreases (here, $V_2<V_0<V_1$). When the operating temperature of the light emitting device is lower than a certain temperature, the operating voltage of the light emitting device and the operating voltage of the driving transistor move to a linear region of the I-V curve of the driving transistor, and the current of the driving transistor decreases rapidly, which causes the operating current of the light emitting device to decrease rapidly and synchronously, thereby causing the brightness of the light emitting device to decrease significantly.

Each pixel of the display device emits light by combining red, green, and blue sub-pixels. Each sub-pixel comprises a light emitting device. Because the mobility of the relevant materials (such as organic materials) of the light-emitting devices of the red, green, and blue sub-pixels is different, the operating voltages of the three sub-pixels at different temperatures are different. In order to prevent the white light synthesized by these sub-pixels from changing with temperature, a material whose mobility is most sensitive to temperature among the materials of the light emitting devices of the three sub-pixel may be studied.

Figure 2A:
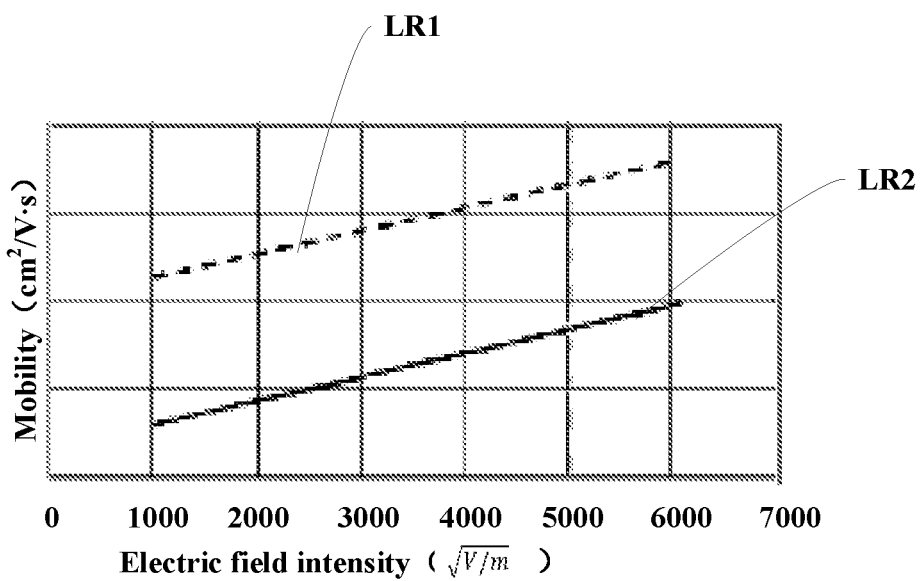
FIG. 2A is a graph showing a relationship between a hole mobility and an electric field intensity of an organic material for a red sub-pixel at different temperatures according to an embodiment of the present disclosure.

FIG. 2A is a graph showing a relationship between a hole mobility and an electric field intensity of an organic material (for example, a hole transport layer) for a red sub-pixel at different temperatures according to an embodiment of the present disclosure. For example, FIG. 2A shows a relationship curve LR1 of the hole mobility and the electric field intensity of an organic material for a red sub-pixel at an operating temperature of 25° C. and a relationship curve LR2 of the hole mobility and the electric field intensity of an organic material for a red sub-pixel at an operating temperature of −20° C.

Figure 2B:
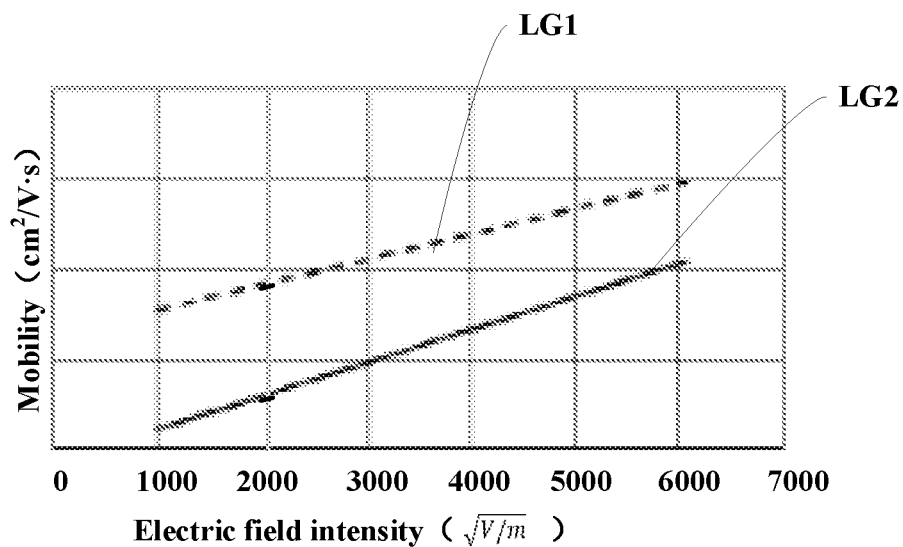
FIG. 2B is a graph showing a relationship between a hole mobility and an electric field intensity of an organic material for a green sub-pixel at different temperatures according to an embodiment of the present disclosure.

FIG. 2B is a graph showing a relationship between a hole mobility and an electric field intensity of an organic material (for example, a hole transport layer) for a green sub-pixel at different temperatures according to an embodiment of the present disclosure. For example, FIG. 2B shows a relationship curve LG1 of the hole mobility and the electric field intensity of an organic material for a green sub-pixel at an operating temperature of 25° C. and a relationship curve LG2 of the hole mobility and the electric field intensity of an organic material for a green sub-pixel at an operating temperature of −20° C.

Figure 2C:
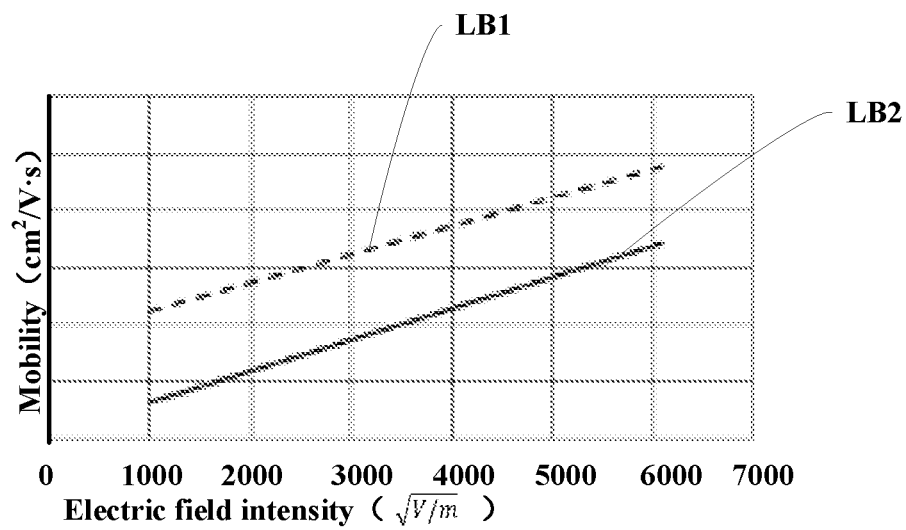
FIG. 2C is a graph showing a relationship between a hole mobility and an electric field intensity of an organic material for a blue sub-pixel at different temperatures according to an embodiment of the present disclosure.

FIG. 2C is a graph showing a relationship between a hole mobility and an electric field intensity of an organic material (for example, a hole transport layer) for a blue sub-pixel at different temperatures according to an embodiment of the present disclosure. For example, FIG. 2C shows a relationship curve LB1 of the hole mobility and the electric field intensity of an organic material for a blue sub-pixel at an operating temperature of 25° C. and a relationship curve LB2 of the hole mobility and the electric field intensity for an organic material of a blue sub-pixel at an operating temperature of −20° C.

It should be noted that, in the above-described FIGS. 2A to 2C, the ordinate is the mobility and the abscissa is the electric field intensity. In order to make the relationship curve between the hole mobility and the electric field intensity a straight line, the unit of the electric field intensity is taken as $\sqrt{V/m}$.

It may be seen from FIGS. 2A to 2C that, at a low temperature, a decrease ratio in the mobility of the organic material for the red sub-pixel is higher than a decrease ratio in the mobility of the organic material for the green sub-pixel, and higher than a decrease ratio in the mobility of the organic material for the blue sub-pixel. Moreover, a variation ratio of the mobility of the organic material for the green sub-pixel is relatively close to that of the mobility of the organic material for the blue sub-pixel. Therefore, at a low temperature, the decrease phenomenon in the mobility of the organic material of the red sub-pixel may result in the problems of a rise in the required driving voltage (i.e., the operating voltage) and a drop in the current of the red sub-pixel, thereby resulting in a relatively low proportion of red in the white balance of the display device at a low temperature compared with the proportion of red at a normal white balance.

Figure 2D:
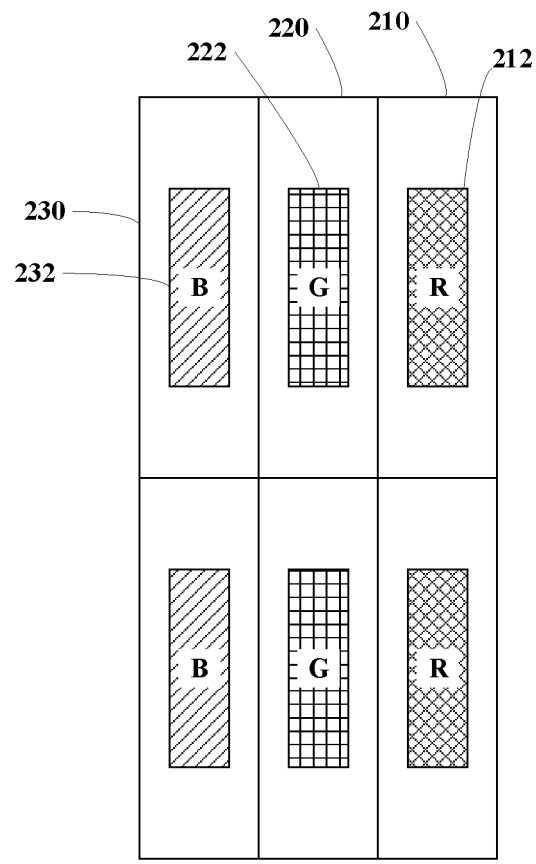
FIG. 2D is a schematic view showing an arrangement of sub-pixels of a pixel in a display substrate according to an embodiment.

FIG. 2D is a schematic view showing an arrangement of sub-pixels a pixel in a display substrate according to an embodiment. As shown in FIG. 2D, the arrangement manner of sub-pixels of the pixel is a BGR sub-pixel arrangement. The pixel comprises a blue sub-pixel 230, a green sub-pixel 220, and a red sub-pixel 210. The blue sub-pixel 230 has an opening 232, the green sub-pixel 220 has an opening 222, and the red sub-pixel 210 has an opening 212. It should be noted that, sizes of the openings of the red, green, and blue sub-pixels in FIG. 2D are only illustrative. In fact, the sizes of the openings of the three colors of sub-pixels may be determined according to the display requirements. Here, the opening of the sub-pixel is a light emitting area of the sub-pixel. For example, aperture ratios of the three colors of sub-pixels may be different. Here, the aperture ratio refers to the ratio of the size of the opening of the sub-pixel (i.e., an area of the light emitting area of the sub-pixel) to an entire area of the sub-pixel.

In the above-described pixel structure, according to the previous analysis, it may be known that when the operating temperature of the light emitting device of the sub-pixel is lower than a certain temperature, the brightness of the light emitting device may drop. Since the organic materials of the red, green, and blue sub-pixels have different mobilities, the operating voltages required for the three colors of sub-pixels are different at different temperatures. This is because the mobility of the red sub-pixel decreases significantly with the temperature, the driving voltage may also increase greatly, and the operating area of the driving transistor of the red sub-pixel may also drift to the linear region. Therefore, if the mobility of the relevant material of the red sub-pixel is affected more by the temperature than that of the relevant material of the blue and green sub-pixels, there might be a risk of turning cyan when a display screen is used in cold areas. This is because the brightness attenuation of the red sub-pixels is larger than that of the sub-pixels of other colors, resulting in a colder color temperature displayed on the screen.

It should be noted that, it has been studied above that under some temperature conditions, the brightness of red subpixels decreases more at low temperatures than the green and blue subpixels. However, the scope of the embodiments of the present disclosure is not limited thereto. For example, under other temperature conditions, the brightness of the green sub-pixel might decrease more at a low temperature than the red and blue sub-pixels. For another example, under further temperature conditions, the brightness of the blue sub-pixel might decrease more at a low temperature than the red and green sub-pixels. The inventors of the present disclosure have found that the above-described condition may result in a color cast phenomenon of the display substrate at a low temperature.

In view of this, the embodiments of the present disclosure provide a display substrate to reduce the color cast phenomenon of the display substrate at a low temperature.

Figure 3:
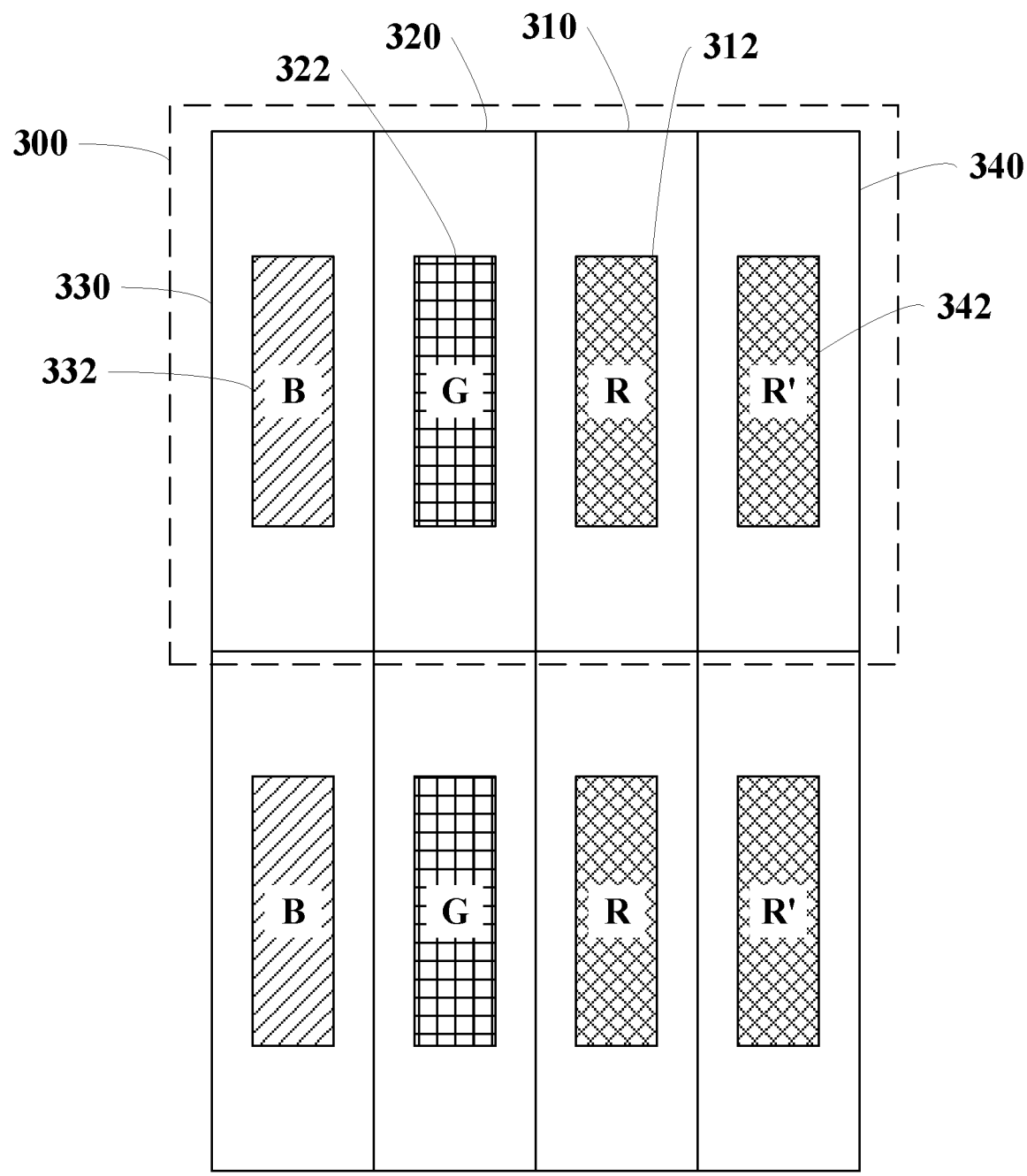
FIG. 3 is a schematic view showing an arrangement of sub-pixels of a pixel in a display substrate according to an embodiment of the present disclosure.

FIG. 3 is a schematic view showing an arrangement of sub-pixels a pixel in a display substrate according to an embodiment of the present disclosure.

As shown in FIG. 3, the display substrate comprises a plurality of pixels 300. Each pixel 300 may comprise a plurality of sub-pixels. Each pixel 300 comprises a first sub-pixel 310, a second sub-pixel 320, a third sub-pixel 330, and a fourth sub-pixel 340. The first sub-pixel 310, the second sub-pixel 320, and the third sub-pixel 330 have different light emission colors. For example, the first sub-pixel 310 is a red sub-pixel R, the second sub-pixel 320 is a green sub-pixel G, and the third sub-pixel 330 is a blue sub-pixel B. The fourth sub-pixel 340 has the same light emission color as the first sub-pixel 310. For example, the fourth sub-pixel 340 is a red sub-pixel R'.

In addition, FIG. 3 also shows an opening of each sub-pixel, such as an opening 312 of the first sub-pixel 310, an opening 322 of the second sub-pixel 320, an opening 332 of the third sub-pixel 330, and an opening 342 of the fourth sub-pixel 340. Sizes of the openings (or aperture ratios) of the four sub-pixels shown in FIG. 3 are only illustrative, and the sizes of the openings of the four sub-pixels in an actual device may be determined according to the display requirements. For example, the aperture ratios of the four sub-pixels of each pixel may be different.

The first sub-pixel 310, the second sub-pixel 320, the third sub-pixel 330, and the fourth sub-pixel 340 all emit light, in a case where an ambient temperature is less than a first threshold. For example, at a low temperature, the first sub-pixel 310, the second sub-pixel 320, the third sub-pixel 330, and the fourth sub-pixel 340 all emit light. For the sub-pixels with different materials, the value of the first threshold is different. In some embodiments, the first threshold may range from −10° C. to 0° C. Of course, those skilled in the art can understand that the first threshold may also take other values, which may be determined according to needs or actual conditions.

The second sub-pixel 320 and the third sub-pixel 330 both emit light, and one of the fourth sub-pixel 340 and the first sub-pixel 310 emits light, in a case where the ambient temperature is greater than or equal to the first threshold. For example, at a non-low temperature (for example, room temperature), the second sub-pixel 320 and the third sub-pixel 330 both emit light, and the fourth sub-pixel 340 emits light or the first sub-pixel 310 emits light.

So far, a display substrate according to some embodiments of the present disclosure is provided. The display substrate comprises a plurality of pixels. Each pixel comprises a first sub-pixel, a second sub-pixel, a third sub-pixel, and a fourth sub-pixel. The first sub-pixel, the second sub-pixel, and the third sub-pixel have different light emission colors. A light emission color of the fourth sub-pixel is the same as that of the first sub-pixel. The first sub-pixel, the second sub-pixel, the third sub-pixel, and the fourth sub-pixel all emit light in a case where an ambient temperature is less than a first threshold. The second sub-pixel and the third sub-pixel emit light, and only one of the fourth sub-pixel and the first sub-pixel emits light, in a case where the ambient temperature is greater than or equal to the first threshold. This may reduce the color cast phenomenon of the display substrate at a low temperature.

In the above-described embodiment, in a pixel containing three BGR sub-pixels, a fourth sub-pixel is added. Here, a sub-pixel with the largest change in brightness with the voltage may be selected as the fourth sub-pixel according to the characteristics of an actual device. That is, the fourth sub-pixel is configured to compensate the brightness of the sub-pixel with a maximum decrease amplitude in the brightness at a low temperature. Here, taking the fourth sub-pixel which is a red sub-pixel as an example, the fourth sub-pixel R' is added to the pixel. The structure of each pixel is changed from a BGR structure to a BGRR' structure. The fourth sub-pixel R' is a separate sub-pixel. At a non-low temperature (for example, room temperature), the second sub-pixel and the third sub-pixel both emit light, and the fourth sub-pixel or the first sub-pixel emits light; at a low temperature (i.e., in the case where the ambient temperature is less than the first threshold), the fourth sub-pixel emits light, and the first, second, and third sub-pixels also emit light. In the previous analysis, at some temperatures, in each pixel, the brightness of the red sub-pixel decreases more at a low temperature than the green and blue sub-pixels, and the fourth sub-pixel may compensate the light emission brightness of the above-described red sub-pixel at a low temperature. For example, the brightness of all the red sub-pixels in each pixel at a low temperature may be changed to a maximum of twice the original brightness. This may reduce the color cast phenomenon of the display substrate at a low temperature.

In some embodiments, as shown in FIG. 3, in each pixel 300, the first sub-pixel 310, the second sub-pixel 320, the third sub-pixel 330, and the fourth sub-pixel 340 are in a same row. The third sub-pixel 330 and the first sub-pixel 310 are on both sides of the second sub-pixel 320, respectively. That is, the second sub-pixel 320 is between the first sub-pixel 310 and the third sub-pixel 330. The fourth sub-pixel 340 is on a side of the first sub-pixel 310 remote from the second sub-pixel 320. For example, a light emission color of the first sub-pixel 310 is red, a light emission color of the second sub-pixel 320 is green, and a light emission color of the third sub-pixel 330 is blue. In this way, the arrangement manner of sub-pixels in each pixel, that is, BGRR', is realized.

It should be noted that, as described above, the fourth sub-pixel is adjacent to the first sub-pixel. However, those skilled in the art may understand that in each pixel, the first sub-pixel may also not be adjacent to the fourth sub-pixel.

It should be noted that the fourth sub-pixel which has a red light emission color is taken as an example for description above. However, those skilled in the art may understand from the above description that the light emission color of the fourth sub-pixel may also be green or blue. That is, at some temperatures, in a case where the brightness of the green sub-pixel decreases significantly, the fourth sub-pixel is a green sub-pixel; at other temperatures, in a case where the brightness of the blue sub-pixel decreases significantly, the four sub-pixel is a blue sub-pixel. Therefore, the scope of the embodiments of the present disclosure is not limited thereto.

Figure 4:
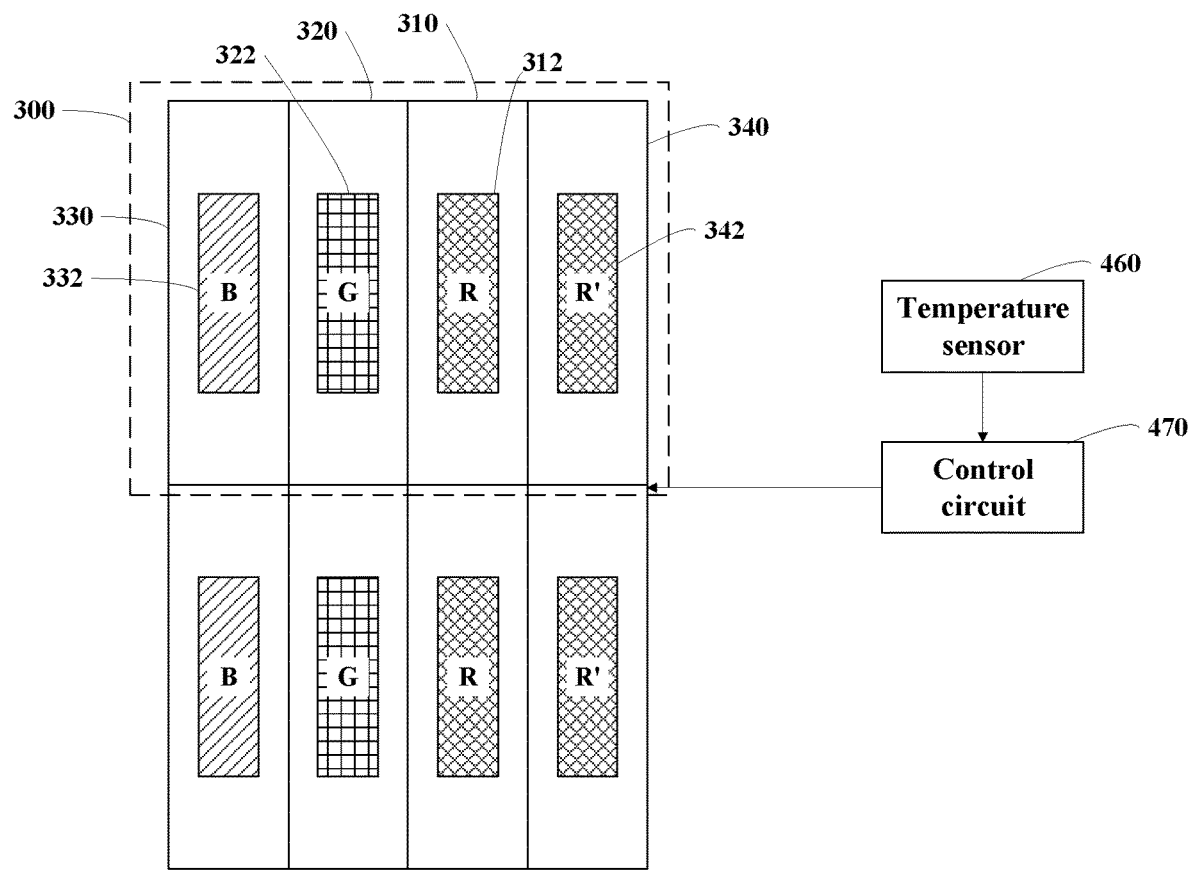
FIG. 4 is a schematic structural view showing a display substrate according to an embodiment of the present disclosure.

FIG. 4 is a schematic structural view showing a display substrate according to an embodiment of the present disclosure.

As shown in FIG. 4, in addition to a plurality of pixels, the display substrate may further comprise a temperature sensor 460 and a control circuit 470.

The temperature sensor 460 is configured to measure the ambient temperature. The temperature sensor 460 may transmit a measured ambient temperature to the control circuit 470.

The control circuit 470 is configured to control light emission brightness of the fourth sub-pixel 340 according to the ambient temperature. For example, at a normal temperature (for example, room temperature), the control circuit 470 controls the fourth sub-pixel 340 not to emit light; when the temperature sensor 460 senses a low temperature, the control circuit 470 controls the fourth sub-pixel to emit light and controls the light emission brightness of the fourth sub-pixel according to the ambient temperature. The lower the ambient temperature is, the higher the light emission brightness of the fourth sub-pixel will be. This also reduces the color cast phenomenon of the display substrate at different temperatures.

In the embodiment, a temperature sensor and a control circuit are provided in the display substrate. The temperature sensor may transmit the ambient temperature to the control circuit, and the control circuit controls the light emission brightness of the fourth sub-pixel according to the ambient temperature. This reduces the color cast phenomenon of the display substrate at different temperatures.

In some embodiments, the control circuit 470 may be further configured to control light emission brightness of the first sub-pixel, the second sub-pixel, and the third sub-pixel according to the ambient temperature. In this way, the control circuit 470 may control the light emission brightness of respective sub-pixels of each pixel according to the measured ambient temperature.

For example, the control circuit 470 may be configured to control the first sub-pixel 310, the second sub-pixel 320, the third sub-pixel 330, and the fourth sub-pixel 340 to emit light in a case where the ambient temperature is less than the first threshold; and control the second sub-pixel 320 and the third sub-pixel 330 to both emit light, and one of the fourth sub-pixel 340 and the first sub-pixel 310 to emit light, in a case where the ambient temperature is greater than or equal to the first threshold. This reduces the color cast phenomenon of the display substrate at different temperatures.

It should be noted that the above-described light emission brightness comprises not only the specific brightness when the sub-pixel emits light, but also the case where the light emission brightness is 0. Here, the case where the light emission brightness is 0 is the case where the sub-pixel does not emit light.

In some embodiments, the color adjustment and verification in different temperature intervals may be repeated based on multiple experimental data, so that the color cast at different temperatures may be finally compensated. During operation of the display substrate, the temperature sensor feedbacks the sensed temperature parameter (ambient temperature) to the control circuit, and the control circuit controls the light emission brightness of each sub-pixel based on the data in the database, thereby achieving normal display of image quality at different temperatures, and reducing the color cast phenomenon caused by low or high temperature.

After research, the inventors of the present disclosure have found that since the red sub-pixel material has a high mobility at a high temperature, the first sub-pixel and the fourth sub-pixel are used to display under low temperature and cold conditions, so that it is possible to increase the brightness of red light and reduce the color cast phenomenon at a low temperature. For example, there is a phenomenon of turning cyan in the white balance of the pixel at a low temperature, which is a color cast phenomenon. However, since the mobility of the red sub-pixel has a large increase amplitude at a high temperature, it is also possible to result in a phenomenon of turning red in the display substrate at a high temperature, which is also a color cast phenomenon. In order to reduce the color cast phenomenon, the following design may also be made.

Figure 5:
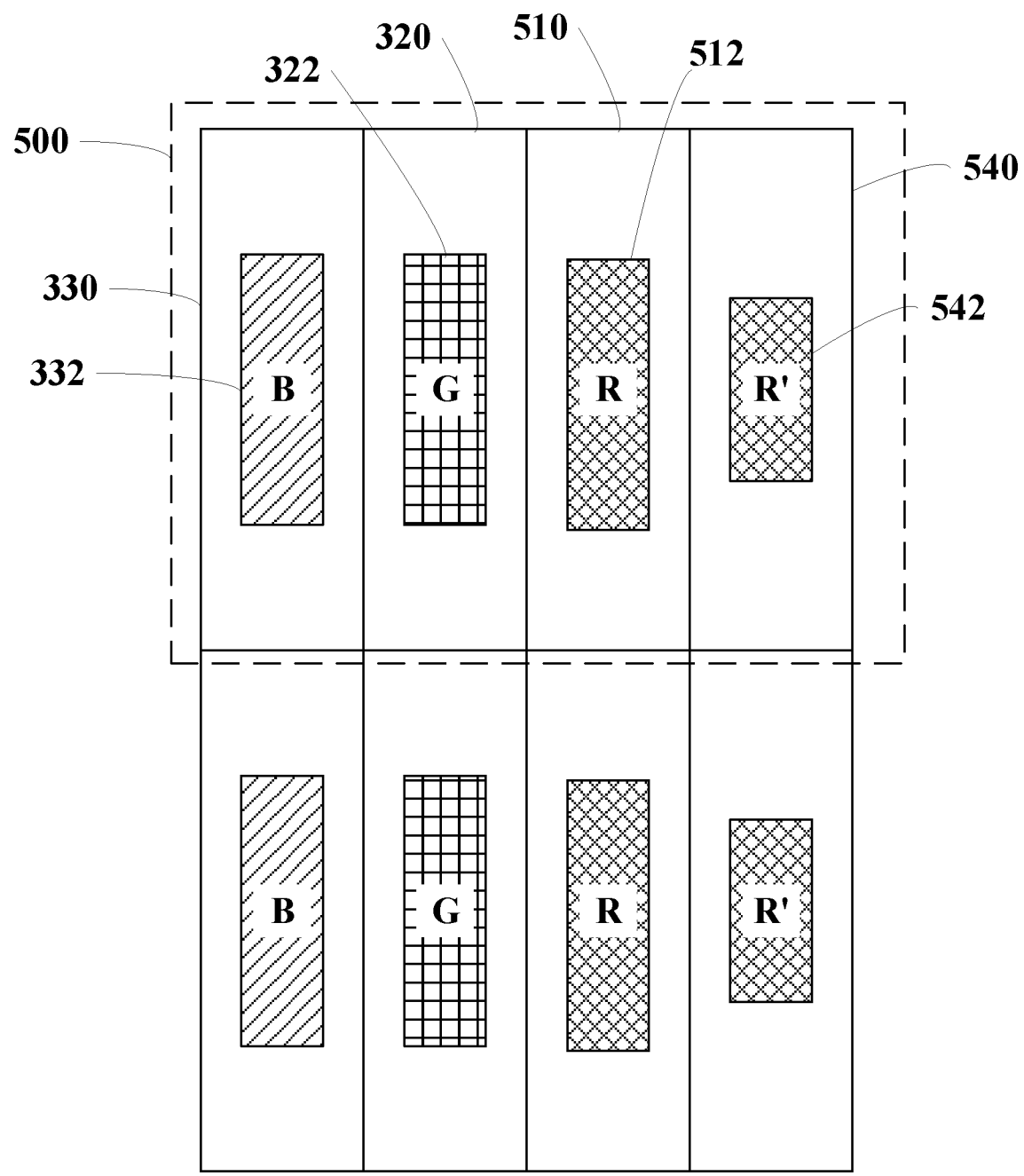
FIG. 5 is a schematic view showing an arrangement of sub-pixels of a pixel in a display substrate according to another embodiment of the present disclosure.

FIG. 5 is a schematic view showing an arrangement of sub-pixels a pixel in a display substrate according to another embodiment of the present disclosure.

As shown in FIG. 5, the display substrate comprises a plurality of pixels 500. Each pixel 500 comprises a plurality of sub-pixels. Each pixel 500 comprises a first sub-pixel 510, a second sub-pixel 320, a third sub-pixel 330, and a fourth sub-pixel 540. In some embodiments, an area of an opening 512 of the first sub-pixel 510 is greater than that of an opening 542 of the fourth sub-pixel 540.

The first sub-pixel 310, the second sub-pixel 320, the third sub-pixel 330, and the fourth sub-pixel 340 all emit light in a case where the ambient temperature is less than the first threshold.

The second sub-pixel, the third sub-pixel, and the fourth sub-pixel all emit light, and the first sub-pixel does not emit light, in a case where the ambient temperature is greater than a second threshold. The second threshold is greater than the first threshold. For the sub-pixels with different materials, the value of the second threshold is different. In some embodiments, the second threshold may range from 35° C. to 50° C. Of course, those skilled in the art can understand that the second threshold may also take other values, which may be determined according to needs or actual conditions.

The second sub-pixel and the third sub-pixel both emit light, and one of the fourth sub-pixel and the first sub-pixel emits light, in a case where the ambient temperature is greater than or equal to the first threshold and the ambient temperature is less than or equal to the second threshold.

In the above-described embodiment, the first sub-pixel and the fourth sub-pixel are designed as two sub-pixels having different opening areas. The first sub-pixel is a sub-pixel with a larger opening area (or aperture ratio), and the fourth sub-pixel is a sub-pixel with a smaller opening area (or aperture ratio). At a low temperature (for example, in a case where the ambient temperature is less than the first threshold), the first sub-pixel and the fourth sub-pixel both emit light. At a normal temperature (for example, in a case where the ambient temperature is greater than or equal to the first threshold and the ambient temperature is less than or equal to the second threshold), the first sub-pixel or the fourth sub-pixel may be selected to emit light according to needs. The fourth sub-pixel with a smaller opening emits light at a high temperature (for example, in a case where the ambient temperature is greater than the second threshold). In the above embodiments, the first sub-pixel and the fourth sub-pixel are used to adjust the color, and the second sub-pixel and the third sub-pixel both emit light normally at a low temperature, a normal temperature, and a high temperature. Since the fourth sub-pixel having a smaller opening at a high temperature emits light, the color cast phenomenon of the display substrate at a high temperature may be reduced. For example, this may reduce the phenomenon of turning red for the white balance of the pixel at a high temperature.

In some embodiments, the control circuit may control the light emission brightness of the first sub-pixel 510, the second sub-pixel 320, the third sub-pixel 330, and the fourth sub-pixel 540 according to the ambient temperature.

In some embodiments, as shown in FIG. 5, a shape of an opening of each sub-pixel is a stripe shape, and a length direction of the stripe shape intersects with a row direction, in which sub-pixels in each pixel are arranged. For example, the length direction of the stripe shape of the opening of each sub-pixel is perpendicular to the row direction in which the plurality of sub-pixels BGRR' in each pixel are arranged.

Figure 6:
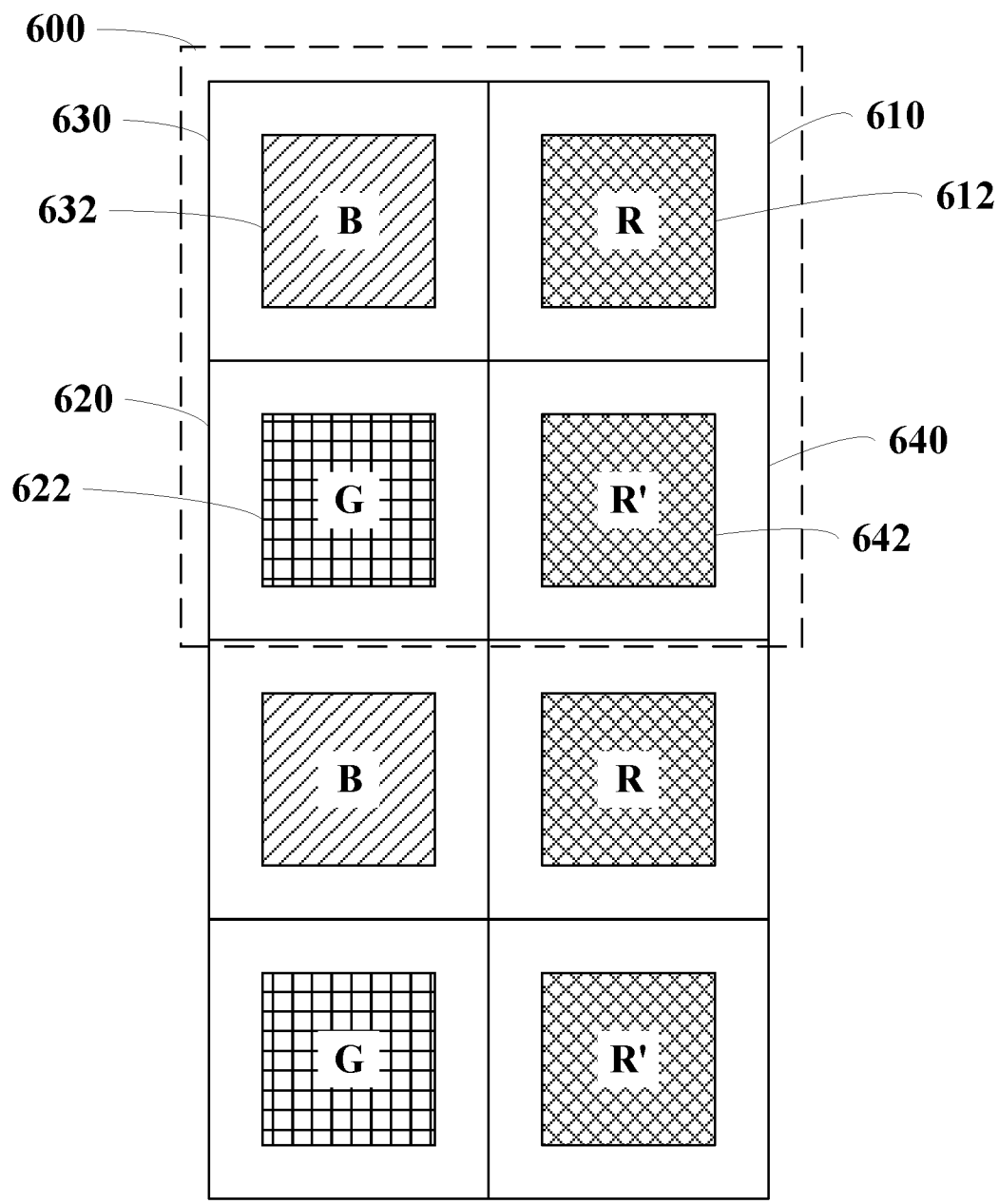
FIG. 6 is a schematic view showing an arrangement of sub-pixels of a pixel in a display substrate according to another embodiment of the present disclosure.

FIG. 6 is a schematic view showing an arrangement of sub-pixels a pixel in a display substrate according to another embodiment of the present disclosure.

As shown in FIG. 6, the display substrate comprises a plurality of pixels 600. Each pixel 600 comprises a plurality of sub-pixels. Each pixel 600 comprises a first sub-pixel 610, a second sub-pixel 620, a third sub-pixel 630, and a fourth sub-pixel 640. As shown in FIG. 6, a shape of an opening of each sub-pixel may be square-like. The third sub-pixel 630 and the first sub-pixel 610 are in a first row. The second sub-pixel 620 and the fourth sub-pixel 640 are in a second row adjacent to the first row. The third sub-pixel 630 and the second sub-pixel 620 are in a first column. The first sub-pixel 610 and the fourth sub-pixel 640 are in a second column adjacent to the first column.

In addition, FIG. 6 also shows the opening of each sub-pixel, such as an opening 612 of the first sub-pixel 610, an opening 622 of the second sub-pixel 620, an opening 632 of the third sub-pixel 630, and an opening 642 of the fourth sub-pixel 640. An area of the opening of each sub-pixel may be determined according to actual conditions. In some embodiments, the area of the opening 612 of the first sub-pixel 610 may be the same as that of the opening 642 of the fourth sub-pixel 640, or may be different from that of the opening 642 of the fourth sub-pixel 640.

In some embodiments, the control circuit may control the light emission brightness of the first sub-pixel 610, the second sub-pixel 620, the third sub-pixel 630, and the fourth sub-pixel 640 according to the ambient temperature.

In some embodiments, each pixel may further comprise a fifth sub-pixel. A light emission color of the fifth sub-pixel is the same as that of the second sub-pixel or the third sub-pixel. In the embodiment, at a low temperature (for example, in a case where the ambient temperature is less than the first threshold) or a high temperature (for example, in a case where the ambient temperature is greater than the second threshold), the light emission brightness of the first sub-pixel has the largest variation, while the light emission brightness of the second sub-pixel or the third sub-pixel has the second largest variation. In such case, in addition to a fourth sub-pixel added to each pixel, a fifth sub-pixel may also be added to each sub-pixel, and the light emission color of the fifth sub-pixel is the same as that of the second sub-pixel or the third sub-pixel. This may further reduce the color cast phenomenon of the white balance of the display substrate.

The fifth sub-pixel is configured to compensate the light emission brightness of the sub-pixel with the second largest decrease in brightness at a low temperature. For example, the first sub-pixel, the second sub-pixel, the third sub-pixel, the fourth sub-pixel, and the fifth sub-pixel all emit light, in a case where the ambient temperature is less than the first threshold. The second sub-pixel and the third sub-pixel both emit light, and one of the fourth sub-pixel and the first sub-pixel emits light, in a case where the ambient temperature is greater than or equal to the first threshold. In this way, at a low temperature (i.e., in a case where the ambient temperature is less than the first threshold), the fifth sub-pixel may compensate the light emission brightness of the second sub-pixel or the third sub-pixel.

Figure 7:
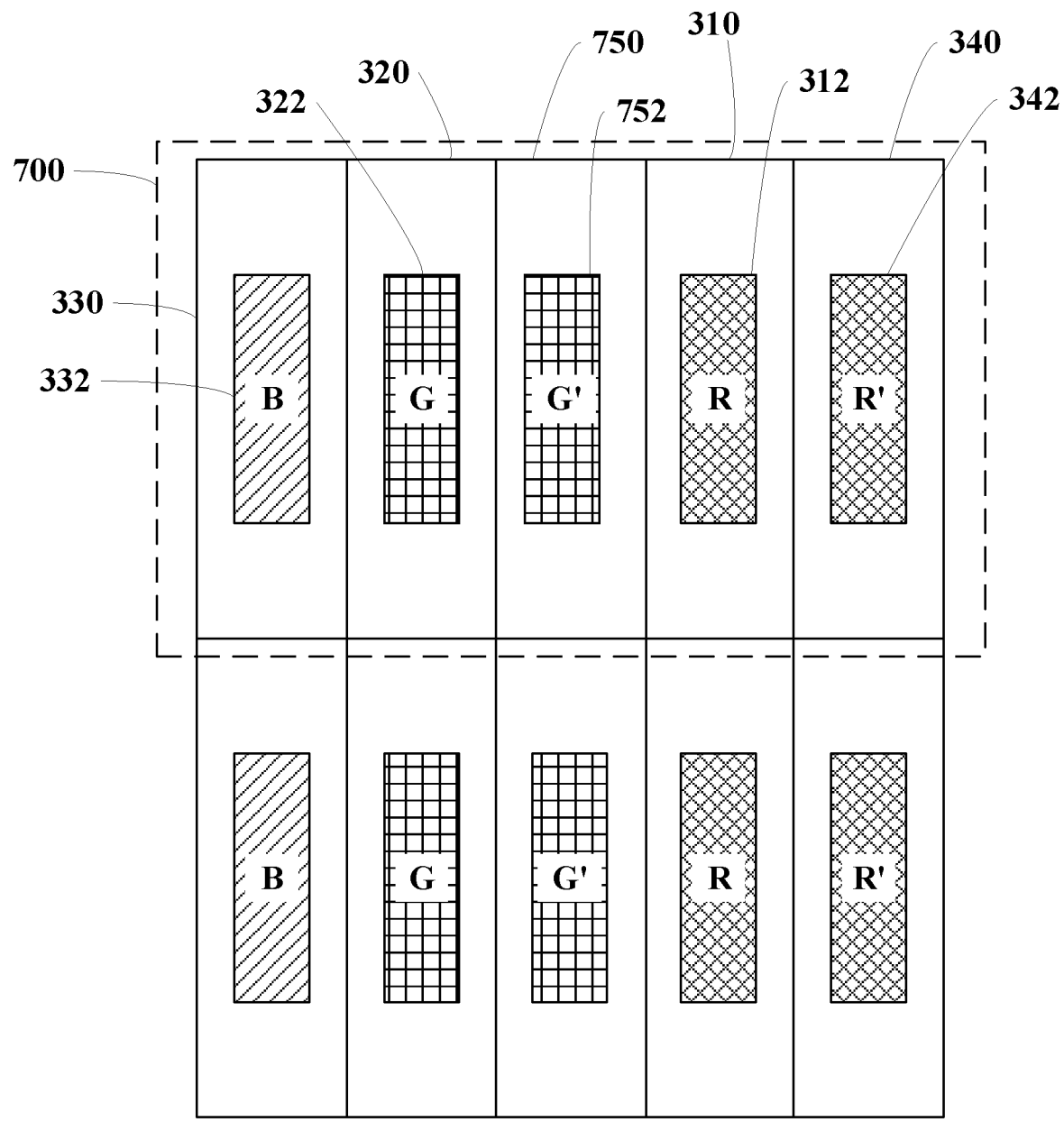
FIG. 7 is a schematic view showing an arrangement of sub-pixels of a pixel in a display substrate according to another embodiment of the present disclosure.

FIG. 7 is a schematic view showing an arrangement of sub-pixels a pixel in a display substrate according to another embodiment of the present disclosure.

As shown in FIG. 7, the display substrate comprises a plurality of pixels 700. Each pixel 700 comprises a plurality of sub-pixels. Each pixel 700 comprises a first sub-pixel 310, a second sub-pixel 320, a third sub-pixel 330, and a fourth sub-pixel 340. In some embodiments, each pixel 700 may further comprise a fifth sub-pixel 750. For example, a light emission color of the fifth sub-pixel 750 is the same as that of the second sub-pixel 320. For example, the light emission color of the fifth sub-pixel 750 is green. The fifth sub-pixel 750 has an opening 752.

As shown in FIG. 7, the fifth sub-pixel 750 is adjacent to the second sub-pixel 320. However, those skilled in the art can understand that the fifth sub-pixel 750 may not be adjacent to the second sub-pixel 320 as well. Therefore, the scope of the embodiments of the present disclosure is not limited thereto.

In the embodiment, at a low temperature (for example, in a case where the ambient temperature is less than the first threshold) or a high temperature (for example, in a case where the ambient temperature is greater than the second threshold), in addition to a significant change in the light emission brightness of the first sub-pixel, the change in the emission brightness of the second sub-pixel (i.e., the green sub-pixel) is also large. In this case, in addition to a fourth sub-pixel added to each pixel, a fifth sub-pixel may also be added to the each sub-pixel, and the light emission color of the fifth sub-pixel is the same as that of the second sub-pixel. This may further reduce the color cast phenomenon of the white balance of the display substrate.

It should be noted that those skilled in the art can understand that when the sub-pixels most prominently affected by the temperature have certain colors, the fourth and fifth sub-pixels are the sub-pixels of these colors. For example, in some cases, the fourth sub-pixel may be a green sub-pixel or a blue sub-pixel, and the fifth sub-pixel may be a blue sub-pixel. For another example, the fourth sub-pixel is a red sub-pixel, the fifth sub-pixel is a blue sub-pixel, and so on. In this way, display may be performed according to different temperatures by adding different colors of sub-pixels.

In some embodiments, the control circuit may further control the light emission brightness of the fifth sub-pixel 750 according to the ambient temperature.

As described above, an improvement is made to the pixel with the BGR structure. However, the scope of the embodiments of the present disclosure is not limited thereto. For example, a fourth sub-pixel may also be added to a pixel with the GGRB structure, thereby adjusting the white balance of the display substrate at a high or low temperature.

Figure 8:
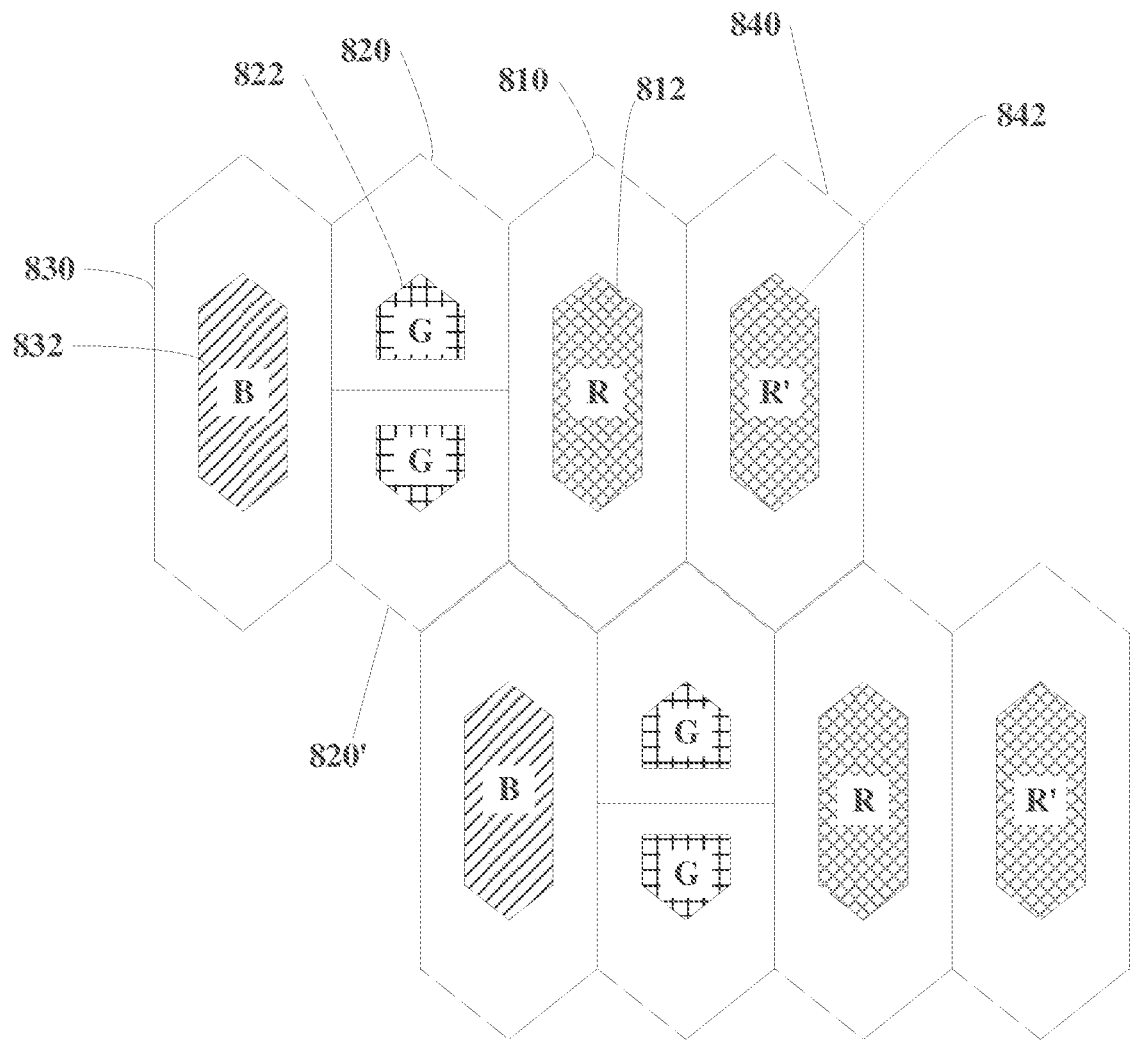
FIG. 8 is a schematic view showing an arrangement of sub-pixels of a pixel in a display substrate according to another embodiment of the present disclosure.

FIG. 8 is a schematic view showing an arrangement of sub-pixels a pixel in a display substrate according to another embodiment of the present disclosure.

As shown in FIG. 8, the display substrate comprises a plurality of pixels. Each pixel comprise a plurality of sub-pixels. Each pixel comprises a first sub-pixel 810, a second sub-pixel 820, a third sub-pixel 830, and a fourth sub-pixel 840. For example, the first sub-pixel 810 is a red sub-pixel R, the second sub-pixel 820 is a green sub-pixel G, the third sub-pixel 830 is a blue sub-pixel B, and the fourth sub-pixel 840 is a red sub-pixel R'. In addition, FIG. 8 also shows an opening 812 of the first sub-pixel 810, an opening 822 of the second sub-pixel 820, an opening 832 of the third sub-pixel 830, and an opening 842 of the fourth sub-pixel 840.

As shown in FIG. 8, each pixel comprises a separate second sub-pixel 820 or 820', and every two pixels share one first sub-pixel 810, one third sub-pixel 830, and one fourth sub-pixel 840. That is, the second sub-pixel 820 or 820' comprised in each pixel is the separate second sub-pixel, and every two pixels share one first sub-pixel 810, one third sub-pixel 830, and one fourth sub-pixel 840. For example, every two pixels share one red sub-pixel R and one blue sub-pixel B, and each pixel has one separate green sub-pixel G.

For example, two adjacent pixels comprise a first pixel and a second pixel. The first pixel comprises one second sub-pixel 820, the first sub-pixel 810, the third sub-pixel 830, and the fourth subpixel 840, and the second pixel comprises the other second sub-pixel 820', the first sub-pixel 810, the third sub-pixel 830 and the fourth sub-pixel 840. That is, the one second sub-pixel 820 serves as the second sub-pixel of the first pixel, and the other second sub-pixel 820' serves as the second sub-pixel of the second pixel; and the first sub-pixel 810, the third sub-pixel 830, and the fourth sub-pixel 840 serve not only as the first, third, and fourth sub-pixels of the first pixel, but also as the first, third, and fourth sub-pixels of the second pixel.

In the above-described embodiment, a fourth sub-pixel is added to each pixel. The fourth sub-pixel may be shared by two pixels. It is possible to control the light emission of the fourth sub-pixel and the light emission of other sub-pixels in a manner similar to the foregoing, thereby reducing the color cast phenomenon of the display substrate at a low temperature (or high temperature).

In some embodiments, the control circuit may control the light emission brightness of the first sub-pixel 810, the second sub-pixel 820, the third sub-pixel 830, and the fourth sub-pixel 840 according to the ambient temperature.

In the above-described embodiment, in order to alleviate the condition that the light emission color of the display substrate turns cyan at a low temperature, the GGRB pixel structure may be designed as shown in FIG. 8. The fourth sub-pixel 840 is configured to compensate the brightness attenuation of the red sub-pixel at a low temperature. In some embodiments, the size of the opening of the first sub-pixel may be different from or the same as that of the opening of the fourth sub-pixel.

In other embodiments, a fifth sub-pixel similar to that described above may be added to the above-described pixel. For example, the fifth sub-pixel may be shared by two pixels. This may further reduce the color cast phenomenon of the display substrate at a low temperature (or high temperature).

Figures 9, 10:
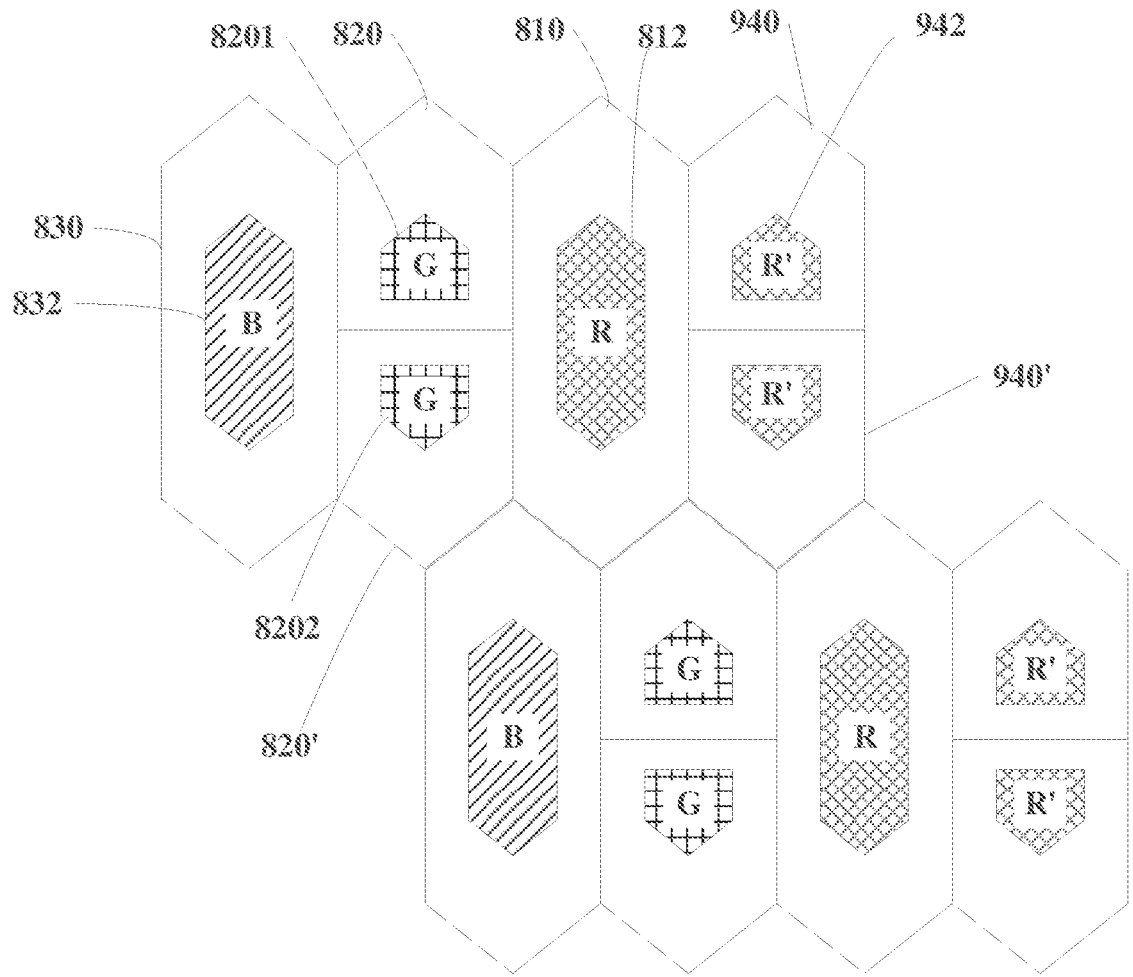
FIG. 9 is a schematic view showing an arrangement of sub-pixels of a pixel in a display substrate according to another embodiment of the present disclosure.
FIG. 10 is a flowchart showing a control method for a display device according to an embodiment of the present disclosure.

FIG. 9 is a schematic view showing an arrangement of sub-pixels a pixel in a display substrate according to another embodiment of the present disclosure.

Compared with the pixel shown in FIG. 8, the pixel of the display substrate shown in FIG. 9 is different in that: each pixel comprises a separate fourth sub-pixel 940 or 940'. That is, in FIG. 9, the fourth sub-pixel is not shared by two pixels. As shown in FIG. 9, each pixel comprises a separate second sub-pixel 820 or 820' and a separate fourth sub-pixel 940 or 940', and every two pixels share one first sub-pixel 810 and one third sub-pixel 830. That is, the second sub-pixel comprised in each pixel is the separate second sub-pixel 820 or 820', the fourth sub-pixel comprised in each pixel is the separate fourth sub-pixel 940 or 940', and every two pixels share one first sub-pixel 810 and one third sub-pixel 830. In addition, FIG. 9 also shows an opening 942 of the fourth sub-pixel 940.

For example, two adjacent pixels comprise a first pixel and a second pixel. The first pixel comprises one second sub-pixel 820, the first sub-pixel 810, the third sub-pixel 830, and one fourth subpixel 940, and the second pixel comprises the other second sub-pixel 820', the first sub-pixel 810, the third sub-pixel 830 and the other fourth sub-pixel 940'. That is, the one second sub-pixel 820 serves as the second sub-pixel of the first pixel, and the other second sub-pixel 820' serves as the second sub-pixel of the second pixel; the one fourth sub-pixel 940 serves as the fourth sub-pixel of the first pixel, and the other fourth sub-pixel 940' serves as the fourth sub-pixel of the second pixel; and the first sub-pixel 810, and the third sub-pixel 830 serve not only as the first, and third sub-pixels of the first pixel, but also as the first, and third sub-pixels of the second pixel.

In some embodiments, the control circuit may control the light emission brightness of the first sub-pixel 810, the second sub-pixel 820, the third sub-pixel 830, and the fourth sub-pixel 940 described above according to the ambient temperature.

In other embodiments, a fifth sub-pixel similar to that described above may be also added to the above-described pixel. The fifth sub-pixel may or may not be shared by two pixels.

It should be noted that those skilled in the art may understand that one (for example, the fifth sub-pixel) or more sub-pixels may be further added to a pixel on the basis of adding the fourth sub-pixel to the pixel. In addition, other arrangement manners of a plurality of sub-pixels in a pixel structure may also be used. Therefore, the scope of the embodiments of the present disclosure is not limited thereto.

In addition, when the fourth sub-pixel is formed, it may be formed by evaporation together with other sub-pixels having the same color (for example, the first sub-pixel), so that the complexity of the process may not be increased. Furthermore, when the fifth sub-pixel is formed, it may also be formed by evaporation together with other sub-pixels (for example, the second sub-pixel or the third sub-pixel) having the same color, so that the complexity of the process may not be increased.

In some embodiments of the present disclosure, a display device is also provided. The display device comprises the display substrate as described above. For example, the display device may be any product or member having a display function, such as a display panel, a mobile phone, a tablet computer, a television, a display, a notebook computer, a digital photo frame, a navigator, or the like.

FIG. 10 is a flowchart showing a control method for a display device according to an embodiment of the present disclosure.

The display device comprises a display substrate. For example, the display substrate is the display substrate described previously. As shown in FIG. 10, the control method may comprise steps S1002 to S1004.

At step S1002, an ambient temperature is measured.

At step S1004, light emission brightness of respective sub-pixels in each of the plurality of pixels is controlled according to the ambient temperature. For example, the first sub-pixel, the second sub-pixel, the third sub-pixel, and the fourth sub-pixel are all controlled to emit light, in a case where the ambient temperature is less than a first threshold. For another example, the second sub-pixel and the third sub-pixel are controlled to emit light, and one of the fourth sub-pixel and the first sub-pixel is controlled to emit light, in a case where the ambient temperature is greater than or equal to the first threshold.

So far, a control method for a display substrate according to some embodiments of the present disclosure is provided. In the control method, an ambient temperature is measured; and the light emission brightness of respective sub-pixels of each pixel is controlled according to the ambient temperature. The first sub-pixel, the second sub-pixel, the third sub-pixel, and the fourth sub-pixel are all controlled to emit light, in a case where the ambient temperature is less than the first threshold. The second sub-pixel and the third sub-pixel are both controlled to emit light, and one of the fourth sub-pixel and the first sub-pixel is controlled to emit light, in a case where the ambient temperature is greater than or equal to the first threshold. This may reduce the color cast phenomenon of the display substrate at a low temperature.

In some embodiments, an area of an opening of the first sub-pixel is greater than that of an opening of the fourth sub-pixel. The step of controlling the second sub-pixel and the third sub-pixel to both emit light, and one of the fourth sub-pixel and the first sub-pixel to emit light comprises: controlling the second sub-pixel, the third sub-pixel and the fourth sub-pixel to emit light, and the first sub-pixel not to emit light, in a case where the ambient temperature is greater than a second threshold, wherein the second threshold is greater than the first threshold; and controlling the second sub-pixel and the third sub-pixel to emit light, and one of the fourth sub-pixel and the first sub-pixel to emit light, in a case where the ambient temperature is greater than or equal to the first threshold and the ambient temperature is less than or equal to the second threshold. This may reduce the color cast phenomenon of the display substrate at a high temperature.

Figure 11:
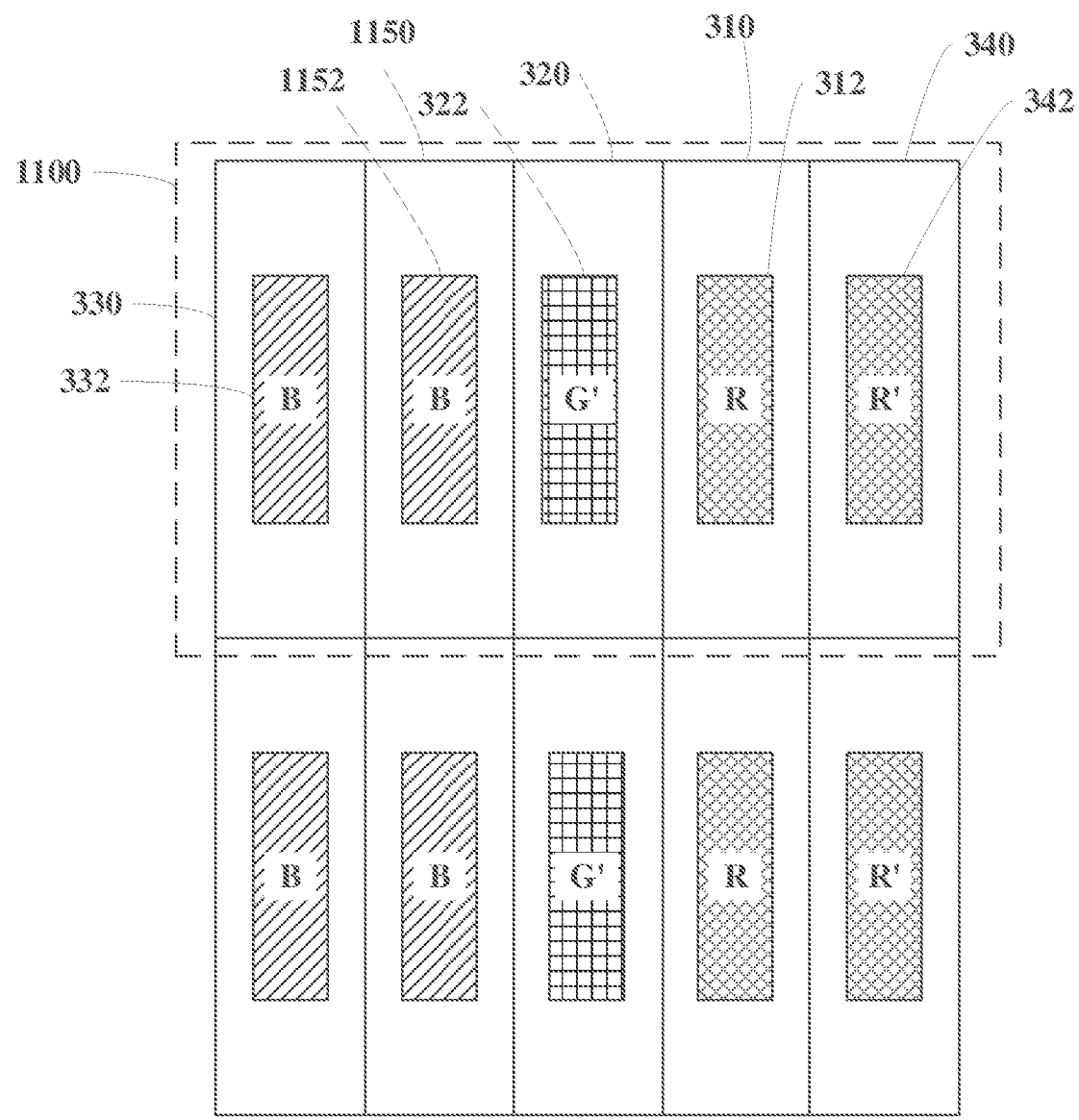
FIG. 11 is a schematic view showing an arrangement of sub-pixels of a pixel in a display substrate according to another embodiment of the present disclosure.

FIG. 11 is a schematic view showing an arrangement of sub-pixels of a pixel in a display substrate according to another embodiment of the present disclosure.

As shown in FIG. 11, the display substrate comprises a plurality of pixels 1100. Each pixel 1100 comprises a plurality of sub-pixels. Each pixel 1100 comprises a first sub-pixel 310, a second sub-pixel 320, a third sub-pixel 330, and a fourth sub-pixel 340 and a fifth sub-pixel 1150. For example, a light emission color of the fifth sub-pixel 1150 is the same as that of the third sub-pixel 330. For example, the light emission color of the fifth sub-pixel 1150 is blue. The fifth sub-pixel 1150 has an opening 1152. As shown in FIG. 11, the fifth sub-pixel 1150 is adjacent to the third sub-pixel 330.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features may be made without departing from the scope and spirit of the present disclosure. The scope of the present disclosure is defined by the appended claim.

What is claimed is:

1. A display substrate, comprising:
a plurality of pixels, each of which comprises a first sub-pixel, a second sub-pixel, a third sub-pixel, and a fourth sub-pixel; wherein:
the first sub-pixel, the second sub-pixel, and the third sub-pixel have different light emission colors, and the fourth sub-pixel has a same light emission color as the first sub-pixel, an area of an opening of the first sub-pixel is greater than that of an opening of the fourth sub-pixel;
the first sub-pixel, the second sub-pixel, the third sub-pixel, and the fourth sub-pixel all emit light, in a case where an ambient temperature is less than a first threshold;
the second sub-pixel, the third sub-pixel, and the fourth sub-pixel all emit light, and the first sub-pixel does not emit light, in a case where the ambient temperature is greater than a second threshold, wherein the second threshold is greater than the first threshold; and
the second sub-pixel and the third sub-pixel both emit light, and one of the fourth sub-pixel and the first sub-pixel emits light, in a case where the ambient temperature is greater than or equal to the first threshold and the ambient temperature is less than or equal to the second threshold.

2. The display substrate according to claim 1, wherein:
the third sub-pixel and the first sub-pixel are in a first row, the second sub-pixel and the fourth sub-pixel are in a second row adjacent to the first row, the third sub-pixel and the second sub-pixel are in a first column, and the first sub-pixel and the fourth sub-pixel are in a second column adjacent to the first column.

3. The display substrate according to claim 1, wherein the second sub-pixel comprised in each of the plurality of pixels is a separate second sub-pixel, and every two pixels share one first sub-pixel, one third sub-pixel, and one fourth sub-pixel.

4. The display substrate according to claim 1, wherein:
the second sub-pixel comprised in each of the plurality of pixels is a separate second sub-pixel, the fourth sub-pixel comprised in each of the plurality of pixels is a separate fourth sub-pixel, and every two pixels share one first sub-pixel and one third sub-pixel.

5. The display substrate according to claim 1, wherein a light emission color of the fourth sub-pixel is red, green, or blue.

6. The display substrate according to claim 1, wherein each of the plurality of pixels further comprises a fifth sub-pixel, wherein a light emission color of the fifth sub-pixel is the same as that of the second sub-pixel or the third sub-pixel.

7. The display substrate according to claim 1, wherein a light emission color of the first sub-pixel is red, a light emission color of the second sub-pixel is green, and a light emission color of the third sub-pixel is blue.

8. The display substrate according to claim 1, wherein the first threshold ranges from −10° C. to 0° C.

9. The display substrate according to claim 1, wherein the second threshold ranges from 35° C. to 50° C.

10. A display device, comprising the display substrate according to claim 1.

11. The display substrate according to claim 1, wherein:
in each of the plurality of pixels, the first sub-pixel, the second sub-pixel, the third sub-pixel, and the fourth sub-pixel are in a same row, the second sub-pixel is between the first sub-pixel and the third sub-pixel, and the fourth sub-pixel is on a side of the first sub-pixel remote from the second sub-pixel.

12. The display substrate according to claim 11, wherein:
a shape of an opening of each sub-pixel is a stripe shape, and a length direction of the stripe shape intersects with a row direction, in which sub-pixels in each pixel are arranged.

13. The display substrate according to claim 1, further comprising:
a temperature sensor configured to measure the ambient temperature; and
a control circuit configured to control light emission brightness of the fourth sub-pixel according to the ambient temperature.

14. The display substrate according to claim 13, wherein the control circuit is further configured to control light emission brightness of the first sub-pixel, the second sub-pixel, and the third sub-pixel according to the ambient temperature.

15. A control method for a display device comprising a display substrate, the display substrate comprising: a plurality of pixels, each of which comprises a first sub-pixel, a second sub-pixel, a third sub-pixel, and a fourth sub-pixel; the first sub-pixel, the second sub-pixel, and the third sub-pixel have different light emission colors, and the fourth sub-pixel has a same light emission color as a light emission color of the first sub-pixel; and
the control method comprising:
measuring an ambient temperature; and
controlling light emission brightness of respective sub-pixels in each of the plurality of pixels according to the ambient temperature;
wherein:
the first sub-pixel, the second sub-pixel, the third sub-pixel, and the fourth sub-pixel are all controlled to emit light, in a case where the ambient temperature is less than a first threshold; and
the second sub-pixel and the third sub-pixel are controlled to emit light, and one of the fourth sub-pixel and the first sub-pixel is controlled to emit light, in a case where the ambient temperature is greater than or equal to the first threshold,
wherein an area of an opening of the first sub-pixel is greater than that of an opening of the fourth sub-pixel; and
controlling the second sub-pixel and the third sub-pixel to emit light and one of the fourth sub-pixel and the first sub-pixel to emit light comprises:
controlling the second sub-pixel, the third sub-pixel, and the fourth sub-pixel to emit light, and the first sub-pixel not to emit light, in a case where the ambient temperature is greater than a second threshold, wherein the second threshold is greater than the first threshold; and
controlling the second sub-pixel and the third sub-pixel to emit light, and one of the fourth sub-pixel and the first sub-pixel to emit light, in a case where the ambient temperature is greater than or equal to the first threshold and the ambient temperature is less than or equal to the second threshold.

* * * * *